(12) United States Patent
Freimuth et al.

(10) Patent No.: US 11,545,374 B2
(45) Date of Patent: Jan. 3, 2023

(54) TRANSFERRING OF ELECTRONIC COMPONENTS FROM A FIRST TO A SECOND CARRIER

(71) Applicant: Muehlbauer GmbH & Co. KG, Roding (DE)

(72) Inventors: Marcel Freimuth, Drachselried (DE); Alexander Ruhland, Roetz (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 186 days.

(21) Appl. No.: 17/250,629

(22) PCT Filed: Aug. 23, 2019

(86) PCT No.: PCT/EP2019/072580
§ 371 (c)(1),
(2) Date: Mar. 19, 2021

(87) PCT Pub. No.: WO2020/043613
PCT Pub. Date: Mar. 5, 2020

(65) Prior Publication Data
US 2021/0210365 A1 Jul. 8, 2021

(30) Foreign Application Priority Data
Aug. 27, 2018 (DE) .......................... 102018006771.9

(51) Int. Cl.
*H01L 21/67* (2006.01)
*B65G 47/90* (2006.01)
*H01L 21/68* (2006.01)

(52) U.S. Cl.
CPC ........ *H01L 21/67132* (2013.01); *B65G 47/90* (2013.01); *H01L 21/67259* (2013.01); *H01L 21/681* (2013.01)

(58) Field of Classification Search
CPC ............. B65G 47/90; H01L 21/67132; H01L 21/67259; H01L 21/681
See application file for complete search history.

(56) References Cited

U.S. PATENT DOCUMENTS

| | | | |
|---|---|---|---|
| 4,667,402 | A | 5/1987 | Wilde |
| 4,990,051 | A | 2/1991 | Safabakhsh et al. |

(Continued)

FOREIGN PATENT DOCUMENTS

| | | |
|---|---|---|
| DE | 19822512 A1 | 10/1999 |
| DE | 10349847 B3 | 5/2005 |

(Continued)

*Primary Examiner* — Ronald P Jarrett
(74) *Attorney, Agent, or Firm* — John A. Miller; Shumaker, Loop & Kendrick, LLP

(57) ABSTRACT

A device for transferring components from a first carrier to a second carrier. A first receptacle receives the first carrier so that components carried by the first carrier are oriented towards a second receptacle. A separating device separates the components from the first carrier for transfer to the second carrier. A first conveyor moves the first receptacle transverse to the conveying direction of the second carrier. A second conveyor moves the separating device transverse to the conveying direction of the second carrier. A first inspection device detects one of the components in its position relative to a storage position on the second receptacle guiding the second carrier. A second inspection device is arranged upstream of the storage position and detects one of the subassemblies on the second carrier relative to the second receptacle and signals the position of the subassembly to a controller.

14 Claims, 3 Drawing Sheets

(56) References Cited

U.S. PATENT DOCUMENTS

| | | |
|---|---|---|
| 6,201,306 B1 | 3/2001 | Kurosawa et al. |
| 7,042,580 B1 | 5/2006 | Stanke et al. |
| 2002/0019074 A1 | 2/2002 | Nakazawa et al. |
| 2004/0118512 A1 | 6/2004 | Hiller et al. |
| 2006/0013680 A1 | 1/2006 | Haba et al. |
| 2006/0237142 A1 | 10/2006 | Park et al. |
| 2007/0293022 A1 | 12/2007 | Ko et al. |
| 2008/0086874 A1 | 4/2008 | Cheung et al. |
| 2008/0124842 A1 | 5/2008 | Wang et al. |
| 2008/0210368 A1 | 9/2008 | Zakel et al. |
| 2009/0242124 A1 | 10/2009 | Konno et al. |
| 2011/0291302 A1 | 12/2011 | Mueller et al. |
| 2014/0142740 A1* | 5/2014 | Prakapenka ......... H05K 13/022 700/213 |
| 2016/0308269 A1 | 10/2016 | Marinov |

FOREIGN PATENT DOCUMENTS

| | | |
|---|---|---|
| DE | 102011017218 A1 | 10/2012 |
| DE | 102011104225 A1 | 12/2012 |
| DE | 102013001967 A1 | 8/2014 |
| DE | 102015013495 A1 | 4/2017 |
| DE | 102011104225 B4 | 8/2017 |
| EP | 0140126 A1 | 5/1985 |
| EP | 0565781 B1 | 11/1995 |
| EP | 0906011 A2 | 3/1999 |
| EP | 0949662 A2 | 10/1999 |
| EP | 2764826 A1 | 8/2014 |
| EP | 2491583 B1 | 11/2017 |
| JP | S5267451 A | 6/1977 |
| JP | S53100765 A | 9/1978 |
| JP | S5570041 A | 5/1980 |
| JP | S6097634 A | 5/1985 |
| JP | H01109737 A | 4/1989 |
| JP | H09162204 A | 12/1995 |
| JP | 2002050670 A | 2/2002 |
| JP | 2003109979 A | 4/2003 |
| JP | 2008004936 A | 1/2008 |
| JP | 2009238881 A | 10/2009 |
| JP | 2010161155 A | 7/2010 |
| TW | I588075 B | 6/2017 |
| WO | 2000014789 A1 | 3/2000 |
| WO | 2007137888 A1 | 12/2007 |
| WO | 2017076989 A1 | 5/2017 |

* cited by examiner ined the electronic components to be transferred from the first carrier can be attached.

TRANSFERRING OF ELECTRONIC COMPONENTS FROM A FIRST TO A SECOND CARRIER

CROSS-REFERENCE TO RELATED APPLICATIONS

This application is a National Stage application of International Application No. PCT/EP2019/072580 filed on Aug. 23, 2019 which claims priority to German Patent Application Serial No. DE 10 2018 006 771.9 filed Aug. 27, 2018.

BACKGROUND

Field

Described here are a device and a method for transferring electronic components from a first carrier to a second carrier and a device and a method for applying adhesive to the second carrier. In particular, a device and a method are described for separating an electronic component from the first carrier and transferring it directly to the second carrier after adhesive was applied to the second carrier.

Discussion of the Related Art

When transferring electronic components, in particular chips (or "dies") and in particular when transferring singulated electronic components, the problem generally exists that these can easily be damaged and must therefore be handled with great care. In addition, electronic components are subject to continuous miniaturization, so that the requirements with regard to precision when transferring the electronic components are increasing continuously.

WO2017/076989 A1 relates to a processing system and method for processing a flexible substrate, for example a web, using a tensioner with a vacuum plate that is movable along a transport direction of the flexible substrate with an indexer, which moves the flexible substrate intermittently for processing. The vacuum plate is configured to be moved along the transport direction. An indexer is configured to move the flexible substrate intermittently for processing. A controller is configured to control the tensioner and the indexer such that a relative speed between the indexer and the vacuum plate of the tensioner is maintained above a predetermined threshold under all working conditions, even when the flexible substrate is stopped. The web that can be used in the processing system has a number of electrical structures, which are separated from one another by a distance. These electrical structures can be any type of flexible electronics.

DE 10 2011 104 225 B4 relates to a device for positioning electronic components to be transferred relative to an ejection device, with the ejection device, which has a slide for at least one electronic component and a housing enclosing the slide, the housing having a first light-permeable area. A first carrier provides the electronic components to be transferred. The first carrier has a first side facing the ejection device and a second side facing away from the ejection device. A plurality of electronic components is provided on the second side. An image data acquisition device is designed to acquire image data of a region, in which the slide is designed to interact with the at least one electronic component, through the first light-permeable area of the housing. A controller is designed to determine position data of the electronic component to be transferred from the acquired image data and to generate control commands based on the position data. At least one actuator is designed to move the first carrier and the ejection device relative to one another based on the control commands in order to change an offset between a longitudinal axis of the slide and a central axis of the electronic component to be transferred, wherein the ejection device comprises a first mirror arranged in the interior of the housing.

DE 103 49 847 B3 relates to a positioning device and a positioning method for the transfer of electronic components. Here a semiconductor wafer arranged on a carrier film is arranged above and parallel to a web-like substrate. The wafer can be moved within the wafer plane by means of a wafer holder and additionally rotated about an axis of rotation perpendicular to the wafer plane. An ejection device comprises a push-out needle, which acts by means of a downward movement on the rear side of a chip to be detached and detaches this from the carrier film. The chip detached from the carrier film is placed thereby onto a bonding position on the web-like substrate.

JP 2003-109979 A relates to a device with at least two slides for separating out components from a first carrier. Here the components are each taken up by a suction pipette of a transfer element. In a last step, the transfer element with suction pipettes and components is positioned above a second carrier, which has already been prepared with adhesive, and the components are placed onto the second carrier. In this case the components are not directly transferred from the first carrier to the second carrier but are received following the separation from the first carrier by means of a transfer element and are oriented exactly by the transfer element in a following step and attached to the second carrier.

Other devices and methods for transferring electronic components that form the technological background to the device described here and the method described here are described in JP 5267451 A, EP 0 565 781 B1 and DE 198 22 512 A1, U.S. Pat. No. 4,667,402 B1, US 2008/0086874 A1, EP 2 764 826 A1, US 2002/0019074 A1, US 2009/242124 A1, EP 0 140 126 A1, U.S. Pat. No. 4,990,051 B1, US 2006/237142 A1, US 2007/293022 A1, U.S. Pat. No. 6,201, 306 B1, JP 2009-238881 A, JP 2010-161155 A, JP 60-097634 A, JP 01-109737 A, JP 55-070041 A, JP 2002-050670 A, JP 09-162204 A, JP 53-100765 A, JP 2008-004936 A, WO 2007/137888 A1, WO 2000/014789 A1, EP 949 662 A2, US 2006/013680 A1, US 2016/308269 A1, DE 10 2011 017218 A1, EP 2 491 583 B1.

SUMMARY

Against this background, an arrangement and a procedure are required with which the throughput when transferring components from the first to the second carrier is to be increased with a high level of accuracy and reproducibility. It should also be possible to use second carriers that are barely transparent to completely untransparent without any loss of quality in the positional accuracy of the component assembly. Finally, the components should be handled carefully.

To achieve this object, a device is proposed for transferring electronic components from a first carrier to a second carrier, wherein the first carrier carries a plurality of singulated components detachably therefrom, and the second carrier is configured to be practically endless and carries a plurality of electronic subassemblies in its longitudinal and transverse extension, to which subassemblies respectively one of the components is to be transferred from the first carrier, and wherein the device comprises:

a first receptacle, which is designed to receive the first carrier;

a second receptacle, which is designed for the purpose of guiding the second carrier along its longitudinal extension in a conveying direction of the second carrier; wherein the first receptacle is designed to receive the first carrier such that the components supported by it are oriented towards the second receptacle;

a separating device, which is designed to separate the components from the first carrier with or without contact to transfer them to the second carrier;

a first conveying device, which is provided and designed to move the first receptacle transversely to the conveying direction of the second carrier relative to the second receptacle;

a second conveying device, which is provided and designed to move the separating device transversely to the conveying direction of the second carrier relative to the second receptacle;

a first inspection device, which is provided and designed to detect at least one of the components in its position relative to a storage position on the second receptacle guiding the second carrier;

a second inspection device, which is arranged upstream of the storage position and is provided and designed to detect at least one of the plurality of electronic subassemblies on the second carrier in its position relative to the second receptacle, and to signal information representing the detected position to a controller;

a third conveying device, which is provided and designed to convey, in response to information signaled by the controller, the second carrier in its position relative to the storage position such that the at least one of the plurality of electronic subassemblies on the second carrier reaches the storage position on the second receptacle guiding the second carrier.

Hitherto, for the assembly of subassemblies or lead frames by means of direct die assembly (DDA), single-row web material has normally been used as the second carrier on which the components from the first carrier are placed. The solution presented permits multi-row web material to be used as the second carrier. The reduced complexity and higher throughput of the direct die arrangement are thereby transferred to the area of systems that are capable of processing multi-row web material. Multi-row web material is conventionally fitted with components in so-called pick-and-place systems or so-called flip-chip systems. The solution proposed here also permits replacement of the previous inspection of the second carrier at the storage position. Even barely transparent to completely untransparent second carriers can thus be used without any loss of quality in the component assembly.

Conventional systems that are designed to process multi-row web material normally work with bond heads, which receive the component in an area outside the web material, position it in an X/Y-direction to the storage positions on the web material and then place it onto the web material in the Z-direction.

To recognize the storage position on the web material before die assembly, conventional DDA systems for single-row web material use a camera, which is mounted directly in the assembly area on the rear/underside of the web material of the second carrier. Due to this arrangement, conventional DDA systems can only process completely transparent materials, e.g., PET, without limiting the assembly precision, untransparent materials not generally being possible as second carriers.

The proposed solution detects the storage position on the web material (spatially/timewise) before the actual component assembly, wherein the second inspection device detects the respective component storage point directly on the second carrier itself, thus not through the second carrier. The second carrier is then conveyed under control to the storage position such that the component storage point aligns as precisely as possible with the position on the first carrier of the component to be stored when the separating device separates this component from the first carrier, and this is then transferred in the Z-direction to the second carrier.

Compared with pick-and-place systems or flip-chip systems, a significantly higher throughput of components can be achieved with the proposed solution on account of its structurally lower complexity. Here the components can be directly separated individually from the (sawn) wafer and placed into the respective subassembly (or lead frame or similar) on the second carrier; an intermediate carrier as on conventional placement machines is no longer necessary. The transparency of the material of the second carrier no longer has any influence on the positional accuracy during storage of the component.

In one variant, the first receptacle with the first carrier is located directly above the second carrier on the second receptacle. In contrast to previous solutions, the first receptacle and the separating device have a movement space transverse to the conveying direction of the second carrier that corresponds at least approximately to the width of the second carrier. The working/component storage area is thereby increased significantly over the width of the second carrier. Several adjacent rows of electronic subassemblies, for example RFID antennas, on a wide second carrier can therefore be reached by the first carrier and can be assembled at the storage position by operation of the separating device.

In one variant, the first carrier has a first side facing the separating device and a second side facing away from the separating device and facing the second carrier on/at the second receptacle, wherein the plurality of components is mounted detachably on the second side of the first carrier; the first inspection device is designed to capture image data of a region in which the separating device is designed to interact with or without contact with at least one of the components, in order to separate this from the first carrier; and the controller is designed to determine, from the image data captured, position data of the component to be transferred and to generate control commands for the separating device and the respective conveying devices based on the position data.

In one variant, the second inspection device is arranged—with regard to the conveying direction of the second carrier—upstream of the storage position at the second carrier and is provided and designed to detect, transversely to the conveying direction of the second carrier, one or more of the plurality of electronic subassemblies respectively on the second carrier in their position relative to the second receptacle, and to signal information representing the position detected to the controller.

In one variant, a first sensor device is associated with the third conveying device, which sensor device is provided and designed to signal to the controller information on the conveying direction and conveying path of the second carrier relative to the storage position.

In one variant, the controller is provided and designed to control the second conveying device, based on the information of the second inspection device regarding the position of the at least one electronic subassembly and the information regarding the conveying direction and conveying path of the second carrier, as well as based on the information of the first inspection device regarding the position of at least one of the components relative to the storage position, in order to move the separating device transversely to the conveying direction of the second carrier to the storage position and to activate the separating device for the purpose of separating the component from the first carrier.

In one variant, the device comprises a fourth conveying device, which is provided and designed to move the first receptacle along the conveying direction of the second carrier relative to the second receptacle in response to information signaled by the controller; and/or a fifth conveying device, which is provided and designed to rotate the first receptacle about an angle (theta) relative to the second receptacle in response to information signaled by the controller.

In another variant, the device comprises a sixth conveying device, which is provided and designed to convey the second carrier, in response to information signaled by the controller, in such a way (slip-free and thus free of elongation) along the conveying direction via the second receptacle that the at least one of the plurality of electronic subassemblies on the second carrier reaches the storage position on the second receptacle guiding the second carrier.

In another variant of the device, the separating device, if it is designed to separate the components from the first carrier with contact, comprises a push pin, which is designed and dimensioned to puncture the first carrier in response to information signaled by the controller in order to detach one of the components from the first carrier in each case and transfer it to the second carrier; or if it is designed to separate the components contactlessly from the first carrier, the separating device comprises a controllable energy source, which is designed and dimensioned to charge the first carrier with energy in response to information signaled by the controller in order to detach one of the components respectively from the first carrier and transfer it to the second carrier.

In another variant of the device, the second receptacle comprises a (circular) cylindrical drum or a convexly curved surface, via which the second carrier reaches the storage position on the second receptacle, wherein in one variant the second receptacle has outlets on its shell/surface guiding the second carrier, which outlets are designed to hold the second carrier on the second receptacle (slip-free and free of elongation) by means of a vacuum.

In another variant, the device comprises a third inspection device, which is arranged—with regard to the conveying direction of the second carrier—downstream of the storage position and is provided and designed to detect at least one of the plurality of electronic subassemblies on the second carrier and the component transferred to it in their position relative to one another, and to signal information representing the detected position to the controller.

In another variant, the device comprises an eighth conveying device, which is provided and designed to convey the second inspection device relative to the second receptacle and the storage position, in order to detect at least one component storage point on the second carrier by the second inspection device and/or to detect at least one of the plurality of electronic subassemblies on the second carrier in its position and to signal information representing the position detected to the controller; and/or a ninth conveying device, which is provided and designed to convey the third inspection device relative to the second receptacle and the storage position, in order to detect at least one of the plurality of electronic subassemblies on the second carrier and the component transferred to it in their position relative to one another, and to signal information representing the position detected to the controller.

Alternatively, the second and/or the third inspection device are supported pivotably on the second receptacle and are adjustable under electronic control or manually in their orientation to the component storage point or the electronic subassemblies on the second carrier and the component transferred to them.

To achieve this object, another device is also proposed for applying adhesive from a reservoir to a second carrier, wherein the second carrier is configured to be practically endless and in its longitudinal and transverse extension supports a plurality of electronic subassemblies to which the adhesive is to be applied, in order thereafter to transfer a component to one of the subassemblies, and wherein the other device comprises: a third receptacle, which is designed for the purpose of guiding the second carrier along its longitudinal extension in a conveying direction of the second carrier; a dispensing device for adhesive, which is designed to output adhesive in a controlled and metered manner towards the third receptacle onto a bonding point on the second carrier at an adhesive application position at which one of the plurality of electronic subassemblies is located; an eleventh conveying device, which is provided and designed to move the dispensing device for adhesive transversely to the conveying direction of the second carrier relative to the third receptacle; a fourth inspection device, which is arranged upstream of the adhesive application position and is provided and designed to detect at least one of the plurality of electronic subassemblies on the second carrier in its position relative to the third receptacle, and to signal information representing the position detected to the controller; a twelfth conveying device, which is provided and designed to convey the second carrier, in response to information signaled by the controller, in its position relative to the adhesive application position in such a way that the at least one of the plurality of electronic subassemblies with the bonding point on the second carrier reaches the adhesive application position on the third receptacle guiding the second carrier.

The device for applying adhesive is advantageously in interaction with and upstream of the device for transferring electronic components from a first carrier to a second carrier but is also to be used independently thereof.

It is the case with regard to the device for applying adhesive also that it permits the use of multi-row web material as the second carrier, wherein the reduced complexity and the higher throughput during adhesive application are transferred to the area of systems that are capable of processing multi-row web material. The solution proposed here for adhesive application also permits replacement of the previous inspection of the second carrier at the adhesive application position. Even barely transparent to completely untransparent second carriers can thus be used without any loss of quality when applying adhesive before component assembly.

To recognize the adhesive application position on the web material before the adhesive application, conventional DDA systems for single-row web material use a camera, which is mounted directly in the assembly area on the rear/underside of the web material of the second carrier. Due to this arrangement, conventional DDA systems can only process completely transparent materials, e.g., PET, without limiting the assembly precision, untransparent materials not generally being possible as a second carrier.

The proposed solution detects the bonding point on the web material (spatially/timewise) before the actual adhesive application, wherein the fourth inspection device detects the respective bonding point—in connection with the respective electronic subassembly—directly on the second carrier itself, thus not through the second carrier. The second carrier is then conveyed in a controlled manner to the adhesive application position in such a way that the bonding point aligns as precisely as possible with the position of the outlet of the dispensing device for adhesive when the dispensing device outputs (meters a portion of) adhesive onto the bonding point.

In one variant, the fourth inspection device, which is arranged—with regard to the conveying direction of the second carrier—upstream of the adhesive application position at the second carrier, is provided and designed to detect, transversely to the conveying direction of the second carrier, one or more respectively of the plurality of electronic subassemblies on the second carrier in their position relative to the third receptacle, and to signal information representing the position detected to the controller.

In one variant, a second sensor device is associated with the twelfth conveying device, which sensor device is provided and designed to signal information to the controller regarding the conveying direction and conveying path of the second carrier relative to the adhesive application position.

In one variant, the controller is provided and designed to control the eleventh conveying device, based on the information of the fourth inspection device regarding the position of the at least one electronic sub-assembly and the information regarding the conveying direction and conveying path of the second carrier, as well as on the basis of the information of the fourth inspection device regarding the position of at least one of the components relative to the adhesive application position, in order to move the dispensing device transversely to the conveying direction of the second carrier to the storage position, and to activate the dispensing device for the purpose of separation of the component from the first carrier.

In one variant, the device comprises a thirteenth conveying device, which is provided and designed to convey the second carrier, in response to information signaled by the controller, in such a way (slip-free and thus free of elongation) along the conveying direction via the second receptacle that the at least one of the plurality of electronic subassemblies on the second carrier reaches the adhesive application position on the second receptacle guiding the second carrier.

In another variant of the device, the third receptacle comprises a (circular) cylindrical drum or a convexly curved surface, via which the second carrier reaches the storage position on the third receptacle, wherein in one variant the second receptacle has outlets on its shell/surface guiding the second carrier, which outlets are designed to hold the second carrier on the third receptacle (slip-free and free of elongation) by means of a vacuum.

In another variant, the device comprises a fifth inspection device, which is arranged—with reference to the conveying direction of the second carrier—downstream of the adhesive application position and is provided and designed to detect at least one of the plurality of electronic subassemblies on the second carrier and the adhesive applied to it in their position relative to one another, and to signal information representing the detected position to the controller.

In another variant, the device comprises a fourteenth conveying device, which is provided and designed to convey the fourth inspection device relative to the third receptacle and the adhesive application position, in order to detect at least one bonding point on the second carrier by the fifth inspection device, to detect at least one of the plurality of electronic subassemblies on the second carrier in its position and to signal information representing the position detected to the controller; and/or a fifteenth conveying device, which is provided and designed to convey the fifth inspection device relative to the third receptacle and the adhesive application position, in order to detect at least one of the plurality of electronic subassemblies on the second carrier and the adhesive applied to it in their position relative to one another, and to signal information representing the position detected to the controller.

Alternatively, the fourth and/or the fifth inspection device are supported pivotably and are adjustable in their orientation under electronic control or manually.

In the devices described above for transferring electronic components from a first carrier to a second carrier and/or for applying adhesive from a reservoir to a second carrier, the second to fifth inspection devices can be configured as follows. Associated with an image capturing device is an illumination device, wherein the illumination device is designed to direct light of different wavelengths onto a second receptacle, which is designed to support an object located on the second carrier that is to be captured by the image capturing device, a sixteenth, seventeenth, eighteenth and/or nineteenth conveying device is designed to convey the respective image capturing device with its associated illumination device along the second receptacle, and an eighth, ninth, fourteenth and/or fifteenth conveying device is provided and designed to convey the respective second, third, fourth and/or fifth inspection device relative to the respective second and/or third receptacle and the component storage position or the adhesive application position along the conveying direction of the second carrier.

In one variant of the inspection device, the illumination device comprises a white light source, an (infra-)red light source and/or an (ultra)-blue light source.

In one variant of the illumination device, the (infra-)red light source and/or the (ultra-) blue light source is configured as a ring light source, which at least partially encloses a capture area of the image capturing device.

In one variant of the inspection device, the white light source is arranged on a side, remote from the capture area of the image capturing device, of an at least partially light-permeable beam deflector.

In one variant of the inspection device, the image capturing device comprises focusing optics, which are arranged at a distance, which can be set fixedly, from the side of an at least partially light-permeable beam deflector facing the optics.

Even if some of the aspects described above were described with reference to the mode of operation of the device, these aspects can also relate to the structure of the device. In exactly the same way, the aspects described above with reference to the device can apply correspondingly to the mode of operation. Although the individual aspects of the device and the mode of operation are described in association, so as to explain their interaction, they are also disclosed independently of one another, of the other devices and other modes of operation.

BRIEF DESCRIPTION OF THE DRAWINGS

Further objectives, features, advantages, and application possibilities result from the following description of exemplary embodiments, which are not to be understood as restrictive, with reference to the associated drawings. Here all features described and/or depicted show by themselves or in any combination the subject matter disclosed here, even independently of their grouping in the claims or their references. The dimensions and proportions of the components shown in the figures are not necessarily to scale in this case; they may diverge from what is shown here in embodiments to be implemented.

The method and device variants described here, and their functional and operational aspects serve only for a better understanding of their structure, mode of operation and properties; they do not restrict the disclosure to the exemplary embodiments. The figures are partly schematic, wherein substantial properties and effects are depicted significantly enlarged in part to clarify the functions, active principles, technical configurations, and features. Each mode of operation, each principle, each technical configuration and each feature that is/are disclosed in the figures or in the text can be freely combined in any way with all claims, each feature in the text and in the other figures, other modes of operation, principles, technical configurations and features that are contained in this disclosure or result from it, so that all conceivable combinations are to be associated with the devices described. Combinations between all individual implementations in the text, meaning in each section of the description, in the claims and even combinations between different variants in the text, in the claims and in the figures are also comprised in this case and can be made the subject matter of other claims. Nor do the claims limit the disclosure and thus the combination possibilities of all features shown with one another. All disclosed features are explicitly disclosed here also individually and in combination with all other features.

DETAILED DESCRIPTION OF THE EMBODIMENTS

In the figures, components corresponding to one another or similar in function are provided with corresponding reference signs. The method and the device are now described on the basis of exemplary embodiments.

Figure 1:
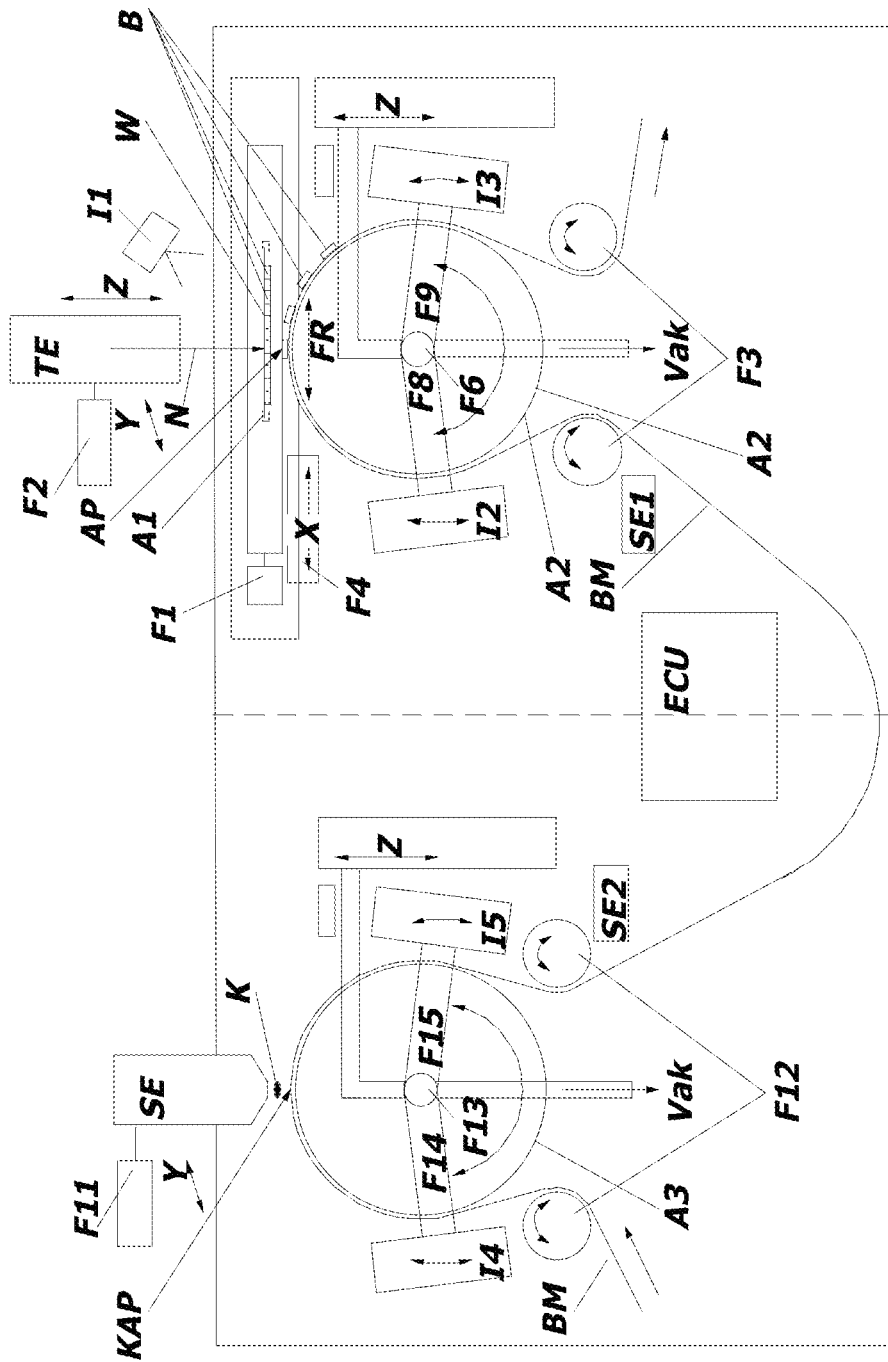
FIG. 1 shows a schematic, lateral plan view of the device for transferring electronic components from a first carrier to a second carrier and a device for applying adhesive to the second carrier.

FIG. 1 shows (on the right-hand side) a device 100 for transferring electronic components B from a first carrier W to a second carrier BM. In this variant, the first carrier W has the design of a roughly circular semiconductor component wafer here and supports a plurality of singulated components B, which are detachable from it in the manner described further below. The second carrier BM is configured as practically endless web material and supports a plurality of electronic subassemblies ANT in its longitudinal and transverse extension. In the variant shown here, the subassemblies ANT are printed antenna sections of an RFID module. One of the components B from the first carrier W is to be transferred respectively to each of the plurality of electronic subassemblies ANT. The device has a first receptacle A1, which is designed to hold the first carrier W. The first receptacle A1 is adapted in its design to the first carrier W.

A second receptacle A2 has the form of a circular cylindrical drum in the variant shown. The second carrier BM is carried via the cylinder-jacket-shaped outer wall along its longitudinal extension in a conveying direction FR. Details of this are explained further below. The first receptacle A1 receives the first carrier W such that the components B supported by it are oriented towards the second receptacle A2. On the side of the first receptacle A1 remote from the second receptacle A2, a separating device TE is provided. The first carrier W has a first side facing the separating device TE and a second side facing away from the separating device that faces the second carrier BM on/at the second receptacle A2. Mounted detachably on the second side of the first carrier W is the plurality of components B. The separating device TE serves to separate the components B from the first carrier W with or without contact, to transfer them to the second carrier BM at a storage position AP.

The first receptacle A1 is part of a table, which is adjustable in X/Y-/theta coordinates and of which individual X-/Y-axes and rotary position theta are each to be adjusted by a conveying device controlled by an electronic controller ECU. In particular, a first conveying device F1 in the form of a linear servo drive is provided and designed to move the first receptacle A1 transversely to the conveying direction FR of the second carrier BM relative to the second receptacle A2. (See also FIG. 2). A second conveying device F2 in the form of a linear servo drive is provided and designed to move the separating device TE transversely to the conveying direction FR of the second carrier BM relative to the second receptacle A2.

A first inspection device I1 in the form of a camera is associated with the separating device TE and serves to detect at least one of the components B in its position relative to a storage position AP on the second receptacle A2 guiding the second carrier BM.

A second inspection device I2 is arranged upstream of the storage position AP and associated with the second receptacle A2. This second inspection device I2 can both be moved in a controlled manner in longitudinal extension of the drum-shaped second receptacle A2, thus transversely to the conveying direction FR of the second carrier BM and be adjusted manually or by motor by a predetermined angular amount along the circumference on the shell surface of the drum-shaped second receptacle A2. For example, the inspection device I2 can be connected to the second receptacle A2 via a pivot arm.

The second inspection device I2 serves to detect at least one of the plurality of electronic subassemblies ANT on the second carrier BM in its position relative to the second receptacle A2, and to signal information representing the position detected to a controller ECU. A third conveying device F3 is formed in this configuration by two transport rollers to be driven under control, which are arranged up- and downstream of the drum-shaped second receptacle A2 and about which the second carrier BM is guided. In response to information signaled by the controller ECU, the second carrier BM is conveyed by the two transport rollers to be driven under control in such a way in its position relative to the storage position AP that the at least one of the plurality of electronic subassemblies ANT on the second carrier BM reaches the storage position AP on the second receptacle A2 guiding the second carrier BM.

Let it be understood here that the storage position AP changes both in the longitudinal direction of the second carrier BM and in its transverse extension according to which subassembly ANT on the second carrier BM is to be fitted with a component B, while a corresponding area of the second carrier BM is located on the second receptacle A2 and is to be brought into alignment with the first carrier W. Accordingly the first carrier W is also to be moved, controlled by the controller ECU, both in the longitudinal direction of the second carrier BM and in its transverse extension.

Multi-row web material can evidently be used as a second carrier. This can be understood to be web material that supports several rows of subassemblies ANT in its transverse extension. Carrier material that is barely transparent to completely untransparent can be used as the second carrier BM without any loss of accuracy in component assembly.

The storage position AP on the web material of the second carrier BM is detected spatially/timewise before the actual component assembly. In this case the second inspection device I2 directly detects the respective component storage point on the second carrier BM itself, thus not through the second carrier. The second carrier BM is then conveyed in a controlled manner to the storage position AP such that the component storage point aligns as precisely as possible with the position of the component to be assembled on the first carrier W when the separating device TE separates this component B from the first carrier W and this is then transferred in the Z-direction to the second carrier BM.

The first receptacle A1 with the first carrier W is located directly above the second carrier BM on the second receptacle A2. Here the first receptacle A1 and the separating device TE have a movement space transversely to the conveying direction FR of the second carrier BM that corresponds at least approximately to the width of the second carrier BM. (See FIG. 2). The working/component assembly area thereby extends approximately over the width of the second carrier BM. In one variant, the movement space of the receptacle A1 and/or the separating device TE transversely to the conveying direction FR of the second carrier BM can be greater than the transverse extension of the second carrier BM, so that at least the first carrier W can be positioned approximately completely or at least the center/center line of the first carrier W can be positioned beyond the transverse extension of the second carrier BM. Several adjacent rows of electronic subassemblies ANT, for example RFID antennas, can therefore be reached on a broad second carrier BM with the first carrier W and can be assembled at the storage position AP by operating the separating device TE.

The first inspection device I1 is designed to capture image data of a region in which the separating device TE is designed to interact with or without contact with at least one of the components B to separate this from the first carrier W.

The controller ECU is designed to determine position data of the component B to be transferred from the captured image data and to generate control commands for the separating device TE and the respective conveying devices F1, . . . Fn based on the position data.

The second inspection device I2 is arranged with reference to the conveying direction X of the second carrier BM on the upstream side of the storage position AP at the second carrier A2 and is provided and designed to detect, transversely to the conveying direction X of the second carrier BM, one or more respectively of the plurality of electronic subassemblies ANT on the second carrier BM in their position relative to the second receptacle, and to signal information representing the position detected to the controller ECU.

Associated with the third conveying device F3 is a first sensor device SE1, which is provided and designed to signal information to the controller ECU about the conveying direction and conveying path of the second carrier BM relative to the storage position AP.

Based on the information of the second inspection device I2 regarding the position of the at least one electronic subassembly ANT and the information regarding the conveying direction and conveying path of the second carrier BM, as well as on the basis of the information of the first inspection device I1 regarding the position of at least one of the components B relative to the storage position AP, the controller ECU serves to control the second conveying device F2. The controller ECU thus causes the separating device TE to be moved (in the conveying direction and) transversely to the conveying direction X of the second carrier BM to the storage position AP, and the separating device TE is activated for the purpose of separating the component B from the first carrier W.

A fourth conveying device F4 serves to move the first receptacle A1 along the conveying direction FR of the second carrier BM relative to the second receptacle A2 in response to information signaled by the controller ECU.

Overall, each component B of the first carrier W can be positioned in this way by corresponding control of the appropriate X-/Y-drives of the conveying devices F1, F4 within a double-dotted and dashed area AF for transferring a component B to the second carrier BM on the second receptacle A2. The double-dotted and dashed area AF can be larger in the transverse extension of the second carrier BM in one variant than the transverse extension of the second carrier BM.

A fifth conveying device F5 serves to rotate the first receptacle A1 about an angle theta relative to the second receptacle A2 in response to information signaled by the controller ECU.

A sixth conveying device F6 can rotate the second receptacle A2 in and against the conveying direction FR in a controlled manner in response to information signaled by the controller ECU. It serves to convey the second carrier BM slip-free and free of elongation along the conveying direction FR via the second receptacle A2 such that the at least one of the plurality of electronic subassemblies ANT on the second carrier BM reaches the respective storage position AP on the second receptacle A2 guiding the second carrier BM.

In one variant, the separating device TE is designed to separate the components B from the first carrier W with contact. To this end it has a push pin N, which is designed and dimensioned to puncture the first carrier W (from above in FIG. 1) in response to information signaled by the controller ECU, in order to detach one of the components B in each case from the first carrier W and transfer it to the second carrier BM. In a second variant, it is designed to separate the components B contactlessly from the first carrier W. To this end the separating device TE has a controllable energy source, which is designed and dimensioned to charge the first carrier W with laser energy, for example, in response to information signaled by the controller ECU, in order to detach one of the components B in each case from the first carrier W and transfer it to the second carrier BM.

The second receptacle A2 is a circular cylindrical drum or a convexly curved surface, via which the second carrier BM reaches the storage position AP on the second receptacle A2. In one variant, the second receptacle A2 has a plurality of small outlets on its shell/surface guiding the second carrier BM, so as to hold the second carrier BM slip-free and free of elongation on the second receptacle A2 by means of a vacuum Vak.

In one variant, the shell/surface of the second receptacle can be designed or the vacuum Vak can be controllable such that no vacuum Vak is present on the shell/surface underneath the storage position, but only on the upstream and downstream side of the storage position AP. The second carrier BM is thus held by a vacuum upstream and downstream of the storage position AP; there is no vacuum at the storage position.

In one variant, the second receptacle A2 can be moved by a conveying device in the Z-direction towards the first receptacle A1 and away from the first receptacle A1 to set a distance between the first and second receptacle.

In another variant, the second receptacle A2 and/or the third receptacle A3 can have compressed air introduced at least at one part of the respective area at which the second carrier BM does not rest on the respective receptacle A2 or A3, which compressed air exits through the openings in order to blow out dirt sucked into the vacuum holes over time.

A third inspection device I3 is arranged with reference to the conveying direction FR of the second carrier BM downstream of the storage position AP at the second receptacle A2. It serves to detect at least one of the plurality of electronic subassemblies ANT on the second carrier BM and the component B transferred to it in their position relative to one another, and to signal information representing the position detected to the controller ECU.

An eighth conveying device F8 serves to convey the second inspection device I2 relative to the second receptacle A2 and the storage position AP in order to detect at least one component storage point on the second carrier BM by the second inspection device I2. The second inspection device I2 is thus movable in a controlled manner both in longitudinal extension of the drum-shaped second receptacle A2, thus transversely to the conveying direction FR of the second carrier BM, and by a predetermined angular amount along the circumference on the shell surface of the drum-shaped second receptacle A2. Alternatively to this, the angle is set manually before operation commences.

At least one of the plurality of electronic subassemblies ANT on the second carrier BM can also be detected in its position in this way to signal information representing the position detected to the controller ECU. Furthermore, a ninth conveying device F9 is provided in this variant to convey the third inspection device I3 relative to the second receptacle A2 and the storage position AP in a manner analogous to how this is carried out by the eighth conveying device F8 for the second inspection device I2. The third inspection device I3 can thus detect at least one of the plurality of electronic subassemblies ANT on the second carrier BM and the component B transferred to it in their position relative to one another and can signal information representing the position detected to the controller ECU.

Another (sub-)device such as is illustrated in FIG. 1 on the lefthand side serves to apply adhesive K from a reservoir to a second carrier BM. As already mentioned, the second carrier BM is configured to be practically endless and in its longitudinal and transverse extension supports a plurality of electronic subassemblies ANT to which the adhesive K is to be applied, in order thereafter to transfer a component B to one of the subassemblies ANT. The other device comprises a third receptacle A3, which serves the purpose of guiding the second carrier BM along its longitudinal extension in a conveying direction FR of the second carrier BM.

A dispensing device SE for adhesive K is provided in FIG. 1 above the third receptacle A3 to dispense adhesive K in a controlled and metered manner towards the third receptacle A3 onto a bonding point KS on the second carrier BM at an adhesive application position KAP, at which one of the plurality of electronic subassemblies ANT is located.

An eleventh conveying device F11 serves to move the dispensing device SE for adhesive K transversely to the conveying direction FR of the second carrier BM relative to the third receptacle A3. A fourth inspection device I4 is associated with the third receptacle A3 and is arranged upstream of the adhesive application position KAP. The fourth inspection device I4 serves to detect at least one of the plurality of electronic subassemblies ANT on the second carrier BM in its position relative to the third receptacle A3, and to signal information representing the position detected to the controller ECU.

A twelfth conveying device F12 is formed in this configuration by two transport rollers to be driven under control, which are arranged respectively on the upstream and downstream side of the drum-shaped third receptacle A3, and around which the second carrier BM is guided. In response to information signaled by the controller ECU, the second carrier BM is conveyed by the two transport rollers to be driven under control in such a way in its position relative to the adhesive application position KAP that the at least one of the plurality of electronic subassemblies ANT with the bonding point KS on the second carrier BM reaches the adhesive application position KAP on the third receptacle A3 guiding the second carrier BM.

In the configuration shown here, the adhesive application device cooperates with the device for transferring components from a first carrier to a second carrier. To this end the device for adhesive application is used on the upstream side of the transfer device for components.

It is the case with regard to the device for adhesive application also that it permits the use of multi-row web material as the second carrier.

In the device, the bonding point is detected on the web material spatially/timewise before the actual adhesive application. Here a fourth inspection device I4 detects the respective bonding point KS at the respective electronic subassembly on the second carrier BM itself directly, thus not through the second carrier BM. The second carrier BM is then conveyed in a controlled manner to the adhesive application position KAP so that the bonding point KS is aligned as precisely as possible with the position of the outlet of the dispensing device SE for adhesive K when the dispensing device dispenses a metered portion of adhesive K onto the bonding point KS.

The fourth inspection device I4 is arranged—with reference to the conveying direction FR of the second carrier BM—upstream of the adhesive application position KAP on the circumference of the drum-shaped third receptacle A3 and serves to detect, transversely to the conveying direction FR of the second carrier BM, respectively one or more of the plurality of electronic subassemblies ANT on the second carrier BM in their position relative to the third receptacle A3, and to signal information representing the position detected to the controller ECU.

Associated with the twelfth conveying device F12 is a second sensor device SE2 to signal information to the controller ECU about the conveying direction and conveying path of the second carrier BM relative to the adhesive application position KAP.

Based on the information of the fourth inspection device I4 regarding the position of the at least one electronic subassembly ANT and the information regarding the conveying direction and conveying path of the second carrier BM, as well as on the basis of the information of the fourth inspection device I4 regarding the position of at least one of the components B relative to the adhesive application position KAP, the controller ECU serves to control the eleventh conveying device F11 to move the dispensing device SE transversely to the conveying direction FR of the second carrier BM.

A thirteenth conveying device F13 serves to convey the second carrier BM along the conveying direction FR via the third receptacle A3 in response to information signaled by the controller ECU. Controlled by the controller ECU, this takes place so slip-free and so free of elongation that the at least one of the plurality of electronic subassemblies ANT on the second carrier BM reaches the adhesive application position KAP on the third receptacle A3 guiding the second carrier BM.

Comparable to the second receptacle A2, the third receptacle A3 is a circular cylindrical drum or a convexly curved surface via which the second carrier BM reaches the adhesive application position KAP on the third receptacle A3. Here, too, the second receptacle has outlets on its shell/surface guiding the second carrier BM, in order to hold the second carrier BM on the third receptacle A3 slip-free and free of elongation by means of the vacuum Vak.

A fifth inspection device I5 is arranged with reference to the conveying direction FR of the second carrier BM downstream of the adhesive application position KAP on the circumference of the drum-shaped third receptacle A3 and serves to detect at least one of the plurality of electronic subassemblies ANT on the second carrier BM and the adhesive K applied to it in their position relative to one another, and to signal information representing the position detected to the controller ECU.

A fourteenth conveying device F14 serves to convey the fourth inspection device F4 relative to the third receptacle A3 and the adhesive application position KAP. The fourth inspection device F4 can thus detect at least one bonding point KS on the second carrier BM, in order to detect at least one of the plurality of electronic subassemblies ANT on the second carrier BM in its position and to signal information representing the position detected to the controller ECU.

A fifteenth conveying device F15 serves to convey the fifth inspection device I5 relative to the third receptacle A3 and the adhesive application position KAP along the circumference of the third receptacle A3. The fifth inspection device I5 can thus detect at least one of the plurality of electronic subassemblies ANT on the second carrier BM and the adhesive K applied to it in their position relative to one another and can signal information representing the position detected to the controller ECU.

Figure 2:
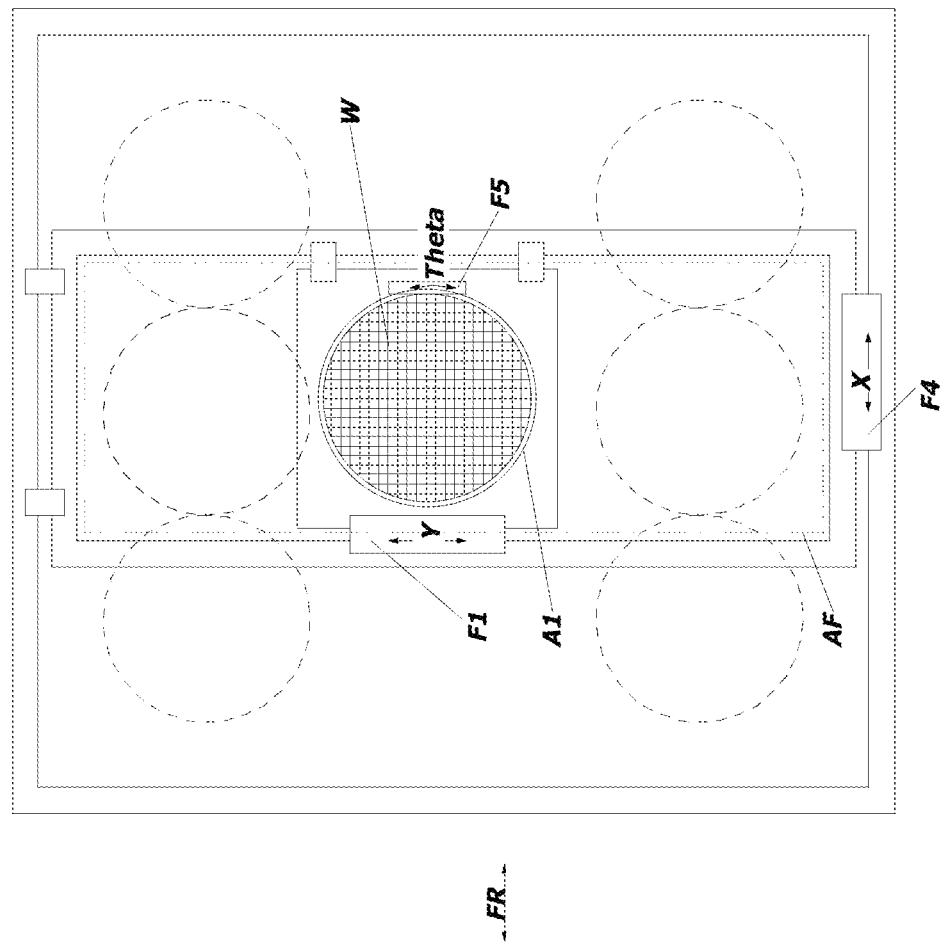
FIG. 2 shows a schematic plan view of a table adjustable in X/Y-/theta coordinates.

The table adjustable in X-/Y-/theta coordinates according to FIG. 2 is configured in a particularly simple and advantageous manner as follows: the receptacle A1 holding the first carrier W is arranged on a first carrier plate, wherein the fifth conveying device F5 serves to rotate the first receptacle A1 about an angle theta relative to the first carrier plate.

The first carrier plate is arranged movably on a second carrier plate in the transverse extension (Y) of the second carrier BM. The first conveying device F1 is provided to move the first carrier plate and thus also the first receptacle A1 (exclusively) transversely to the conveying direction FR of the second carrier BM relative to the second carrier plate.

The second carrier plate is arranged movably on a rigid, third carrier plate or on a support frame in the conveying direction FR of the second carrier BM. The fourth conveying device F4 is provided to move the first receptacle W, the first carrier plate and the second carrier plate (exclusively) in the conveying direction FR of the second carrier BM relative to the third carrier plate.

Figure 3:
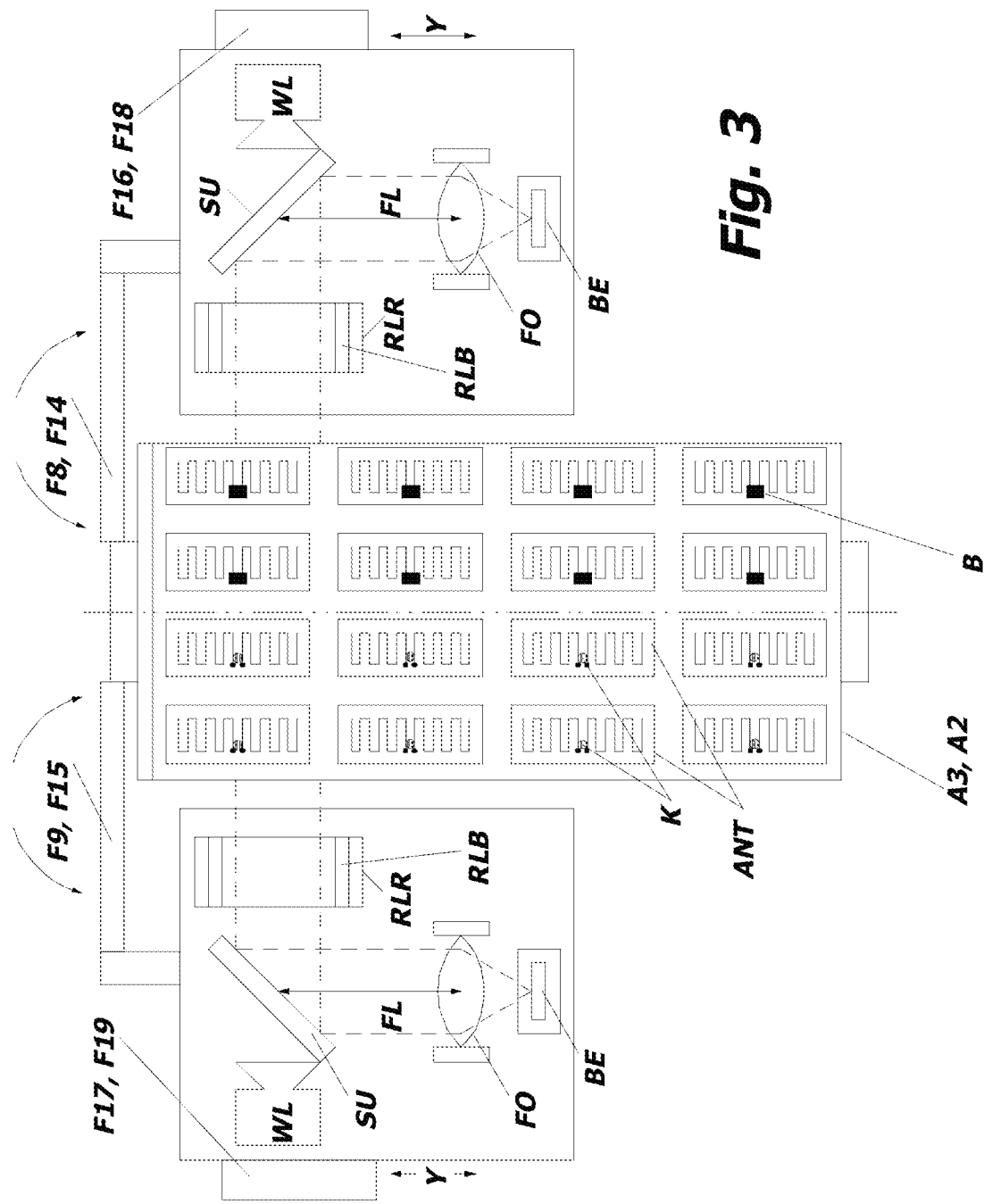
FIG. 3 shows a schematic plan view of the second to fifth inspection device.

In FIG. 3, the second to fifth inspection devices I2 . . . I5 are configured as described below for the devices described above for transferring electronic components B from a first carrier W to a second carrier BM and for applying adhesive K from a reservoir to a second carrier BM.

In one configuration, the image capturing device BE (camera) can be moved in the Y-direction at the inspection devices I2 . . . I5. In this variant the beam deflector can be omitted. Alternatively, the remaining optics comprising focusing optics, beam deflector and/or illumination can be moved in the Y-direction while the camera remains stationary and is not moved in the Y-direction. In this variant the camera is only set at an angle via the pivot arm.

An image capturing device BE in the form of a camera has an associated illumination device WL, RLB, BLB. The illumination device WL, RLB, BLB has a white light source WL, an infrared light source RLR and a blue light source BLB. The illumination device WL, RLB, BLB serves to direct light of different wavelengths onto the second receptacle A2. Different details of the components/subassemblies and of the adhesive can thus be captured visually by the image capturing device BE, which is directed at the second carrier BM.

A sixteenth, seventeenth, eighteenth and/or nineteenth conveying device F16 . . . F19 are each designed to convey the respective image capturing device BE with the illumination device WL, RLB, BLB associated with it along the second or third receptacle A2, A3, i.e., transversely to the conveying direction of the second carrier BM. In other words, sixteenth, seventeenth, eighteenth and/or nineteenth conveying device F16 . . . F19 are Y-drives, and eighth, ninth, fourteenth and/or fifteenth conveying device F8, F9, F14, F15 are motor pivot arms, the function of which can also be manually fulfilled.

The eighth, ninth, fourteenth and/or fifteenth conveying device F8, F9, F14, F15 are used to convey the respective second, third, fourth and/or fifth inspection device I2 . . . I5 relative to the respective second and/or third receptacle A2, A3 and the component assembly position AP or the adhesive application position KAP along the conveying direction FR of the second carrier BM. The respective second, third, fourth and/or fifth inspection device I2 . . . I5 can thereby be advantageously adapted to different spacings of electronic subassemblies on the second carrier.

In the variant of the illumination device WL, RLB, BLB shown, the infrared light RLR and the blue light source RLB are configured as a ring light source enclosing a capture area EB of the image capturing device BE. The white light source WL is arranged on a side of a partially light-permeable beam deflector SU in the form of a 45° mirror, which side is remote from the capture area EB of the image capturing device BE. The image capturing device BE has focusing optics FO arranged at a fixedly adjustable spacing FL from the side facing it of an at least partially light-permeable beam deflector SU.

The invention claimed is:

1. A transfer device for transferring electronic components from a first carrier to a second carrier, wherein
   the first carrier carries a plurality of singulated components detachably therefrom, and
   the second carrier is configured to be practically endless and carries a plurality of electronic subassemblies in its longitudinal and transverse extension, to which subassemblies respectively one of the components is to be transferred from the first carrier, and wherein the transfer device comprises:
a first receptacle, which is designed to receive the first carrier;
a second receptacle, which is designed for the purpose of guiding the second carrier along its longitudinal extension in a conveying direction of the second carrier; wherein
the first receptacle is designed to receive the first carrier such that the components supported by it are oriented towards the second receptacle;
a separating device, which is designed to separate the components from the first carrier with or without contact to transfer them to the second carrier;
a first conveying device, which is provided and designed to move the first receptacle transversely to the conveying direction of the second carrier relative to the second receptacle;
a second conveying device, which is provided and designed to move the separating device transversely to the conveying direction of the second carrier relative to the second receptacle;
a first inspection device, which is provided and designed to detect at least one of the components in its position relative to a storage position on the second receptacle guiding the second carrier;
a second inspection device, which is arranged upstream of the storage position and is provided and designed to detect at least one of the plurality of electronic subassemblies on the second carrier in its position relative to the second receptacle, and to signal information representing the detected position to a controller; and
a third conveying device, which is provided and designed to convey, in response to information signaled by the controller, the second carrier in its position relative to the storage position such that the at least one of the plurality of electronic subassemblies on the second carrier reaches the storage position on the second receptacle guiding the second carrier.

2. The transfer device for transferring electronic components according to claim 1, which detects the storage position on the second carrier before component assembly in that the second inspection device detects the respective component storage point directly on the second carrier itself, then conveys the second carrier under control to the storage position such that the component storage point is aligned with the position on the first carrier of the component to be stored, then the separating device separates this component from the first carrier such that it is transferred to the second carrier.

3. The transfer device for transferring electronic components according to claim 1, in which
the first receptacle with the first carrier is arranged directly above the second carrier on the second receptacle, and the first receptacle and the separating device have a movement space transverse to the conveying direction of the second carrier that corresponds at least approximately to the width of the second carrier.

4. The transfer device for transferring electronic components according to claim 1, in which
the first carrier has a first side facing the separating device and a second side facing away from the separating device that faces the second carrier on/at the second receptacle, wherein mounted detachably on the second side of the first carrier is the plurality of components;
the first inspection device is designed to capture image data of a region in which the separating device is designed to interact with or without contact with at least one of the components to separate this from the first carrier; and
the controller is designed to determine position data of the component to be transferred from the captured image data and to generate control commands for the separating device and the respective conveying device based on the position data.

5. The transfer device for transferring electronic components according to claim 1, in which
the second inspection device is arranged—with reference to the conveying direction of the second carrier—on the upstream side of the storage position at the second carrier and is provided and designed to detect, transversely to the conveying direction of the second carrier, one or more respectively of the plurality of electronic subassemblies on the second carrier in their position relative to the second receptacle, and to signal information representing the position detected to the controller.

6. The transfer device for transferring electronic components according to claim 1, in which
associated with the third conveying device is a first sensor device, which is provided and designed to signal information to the controller about the conveying direction and conveying path of the second carrier relative to the storage position.

7. The transfer device for transferring electronic components according to claim 1, in which
based on the information of the second inspection device regarding the position of the at least one electronic subassembly and the information regarding the conveying direction and conveying path of the second carrier, as well as on the basis of the information of the first inspection device regarding the position of at least one of the components relative to the storage position, the controller is provided and designed to control the second conveying device to move the separating device transversely to the conveying direction of the second carrier to the storage position, and to activate the separating device for the purpose of separating the component from the first carrier.

8. The transfer device for transferring electronic components according to claim 1, in which
a fourth conveying device W is provided and designed to move the first receptacle along the conveying direction of the second carrier relative to the second receptacle in response to information signaled by the controller; and/or
a fifth conveying device is provided and designed to rotate the first receptacle about an angle relative to the second receptacle in response to information signaled by the controller.

9. The transfer device for transferring electronic components according to claim 8, in which
a sixth conveying device is provided and to convey the second carrier along the conveying direction via the second receptacle in response to information signaled by the controller such that the at least one of the plurality of electronic subassemblies on the second carrier reaches the storage position on the second receptacle guiding the second carrier.

10. The transfer device for transferring electronic components according to claim 1, in which the separating device, if it is designed to separate the components from the first carrier with contact, comprises a push pin, which is designed and dimensioned to puncture the first carrier in response to information signaled by the controller in order to detach one of the components from the first carrier in each case and transfer it to the second carrier; or if it is designed to separate the components contactlessly from the first carrier, the separating device comprises a controllable energy source, which is designed and dimensioned to charge the first carrier with energy in response to information signaled by the controller in order to detach one of the components respectively from the first carrier and transfer it to the second carrier.

11. The transfer device for transferring electronic components according to claim 1, in which the second receptacle comprises a circular or cylindrical drum or a convexly curved surface, via which the second carrier reaches the storage position on the second receptacle, wherein in one variant the second receptacle has outlets on its shell/surface guiding the second carrier, which outlets are designed to hold the second carrier on the second receptacle by a vacuum.

12. The transfer device for transferring electronic components according to claim 1, in which a third inspection device is arranged with reference to the conveying direction of the second carrier downstream of the storage position and is provided and designed to detect at least one of the plurality of electronic subassemblies on the second carrier and the component transferred to it in their position relative to one another, and to signal information representing the position detected to the controller.

13. The transfer device for transferring electronic components according to claim 9, in which a seventh conveying device is provided and designed to convey the second inspection device relative to the second receptacle and the storage position in order to detect at least one component storage point on the second carrier by the second inspection device and/or to detect at least one of the plurality of electronic subassemblies on the second carrier in its position and to signal information representing the position detected to the controller; and/or an eighth conveying device, which is provided and designed to convey the third inspection device relative to the second receptacle and the storage position in order to detect at least one of the plurality of electronic subassemblies on the second carrier and the component transferred to it in their position relative to one another and to signal information representing the position detected to the controller.

14. A method for transferring electronic components from a first carrier to a second carrier with the steps:

provision of the first carrier, which supports a plurality of singulated components detachably therefrom, and provision of the second carrier, which is configured to be practically endless and in its longitudinal and transverse extension supports a plurality of electronic subassemblies to which one of the components is to be transferred respectively from the first carrier, provision of a first receptacle, which is designed to receive the first carrier;

provision of a second receptacle, which is designed for the purpose of guiding the second carrier along its longitudinal extension in a conveying direction of the second carrier; wherein the first receptacle is designed to receive the first carrier such that the components supported by it are oriented towards the second receptacle;

provision of a separating device, which is designed to separate the components from the first carrier with or without contact to transfer them to the second carrier;

provision of a first conveying device, which is provided and designed to move the first receptacle transversely to the conveying direction of the second carrier relative to the second receptacle;

provision of a second conveying device, which is provided and designed to move the separating device transversely to the conveying direction of the second carrier relative to the second receptacle;

provision of a first inspection device, which is provided and designed to detect at least one of the components in its position relative to a storage position on the second receptacle guiding the second carrier;

provision of a second inspection device, which is arranged upstream of the storage position and is provided and designed to detect at least one of the plurality of electronic subassemblies on the second carrier in its position relative to the second receptacle, and to signal information representing the detected position to a controller; and provision of a third conveying device, which is provided and designed to convey, in response to information signaled by the controller, the second carrier in its position relative to the storage position such that the at least one of the plurality of electronic subassemblies on the second carrier reaches the storage position on the second receptacle guiding the second carrier.

* * * * *